US008926751B2

(12) United States Patent
Chen et al.

(10) Patent No.: US 8,926,751 B2
(45) Date of Patent: Jan. 6, 2015

(54) GAS FLOW GUIDING DEVICE FOR USE IN CRYSTAL-GROWING FURNACE

(75) Inventors: Jyh-Chen Chen, Jhongli (TW);
Ying-Yang Teng, Jhongli (TW);
Chung-Wei Lu, Jhongli (TW); Hsueh-I Chen, Jhongli (TW)

(73) Assignee: National Central University, Taoyuan County (TW)

( * ) Notice: Subject to any disclaimer, the term of this patent is extended or adjusted under 35 U.S.C. 154(b) by 1070 days.

(21) Appl. No.: 12/958,469

(22) Filed: Dec. 2, 2010

(65) Prior Publication Data

US 2012/0137975 A1 Jun. 7, 2012

(51) Int. Cl.
*C30B 15/02* (2006.01)
*C30B 11/00* (2006.01)
*C30B 28/06* (2006.01)

(52) U.S. Cl.
CPC ............... *C30B 11/006* (2013.01); *C30B 28/06* (2013.01)
USPC .................. 117/81; 117/82; 117/83; 117/220

(58) Field of Classification Search
USPC ........................................ 117/81, 82, 83, 220
See application file for complete search history.

(56) References Cited

U.S. PATENT DOCUMENTS 8,268,074 B2 * 9/2012 Hugo .............................. 117/83
8,317,920 B2 * 11/2012 Kimbel et al. ................ 117/223
2006/0249072 A1 * 11/2006 Csillag et al. ................... 117/43

* cited by examiner

*Primary Examiner* — Bob M Kunemund
(74) *Attorney, Agent, or Firm* — Jackson IPG PLLC

(57) ABSTRACT

The present invention relates to a gas flow guiding device for use in a crystal-growing furnace. The gas flow guiding device has an insulation layer enclosing a crucible, a gas inlet mounted in the upper insulation layer, and a gas exit formed in the lateral insulation layer. A plurality of guide plates are radially arranged around the opening of the gas inlet, so that the free surface of the melt is blown by the guided gas flow in such a manner that the gas flow takes the impurity away from the free surface efficiently. As a result, the crystal ingot obtained by solidifying the melt will exhibit a reduced concentration of impurities and an improved crystal quality.

9 Claims, 6 Drawing Sheets

GAS FLOW GUIDING DEVICE FOR USE IN CRYSTAL-GROWING FURNACE

BACKGROUND OF THE INVENTION

1. Field of the Invention

The present invention relates to a gas flow guiding device for use in a crystal-growing furnace, and more particularly, to a gas flow guiding device for use in a crystal-growing furnace that is capable of effectively reducing the impurities present in a crystal ingot produced thereby.

2. Description of the Prior Art

It is known in the art that a solar cell is a non-pollutant renewable energy source that can directly generate electric power by virtue of the interactions between the sunlight and chemical materials. Especially, the solar cell will not discharge any undesired waste gas during use, such as $CO_2$, so that the solar cell is promising in helping environmental protection and solving the problem of the earth's greenhouse effect.

A solar cell is a device that is capable of converting the solar energy into electrical power by generating a potential difference at the P-N junction interface of a semiconductor device, rather than by transmission of electrically conductive ions via an electrolyte. The semiconductor device will generate a tremendous amount of electrons when struck by the sunlight, and the movement of the electrons results in a potential difference at the P-N junction.

The modern solar cells are typically made by three types of materials: amorphous materials, mono-crystal materials and poly-crystal materials. FIG. 1 illustrates a furnace for producing a silicon crystal ingot, which primarily includes a crucible 21 for containing a silicon melt 11. The crucible 21 is provided circumferentially with a lateral insulation layer 22 and an upper insulation layer 23, so as to constitute a hot zone, in which a heater 24 are equipped to provide heat to silicon.

The upper insulation layer 23 is further provided with a gas inlet 25 used for introducing an inert gas, whereas the lateral insulation layer 22 may be formed with a gas exit 26. During the process of melting the silicon by heat, a gas is introduced into the furnace at a predetermined flow rate through the gas inlet 25 to generate a gas flow passing through the hot zone and, thus, carrying the impurity away from the furnace via the gas exit 26.

A crystal ingot 12 may be obtained by reducing the output power of the heater 24 (casting process), or by moving the lateral insulation layer 22 upwards to allow radiant cooling of the crucible 21 (directional solidification system process), to thereby solidify the silicon melt 11 contained within the crucible 21.

Moreover, the crystal ingot 12 may also be obtained by additionally disposing a support 28 between the crucible 21 and a base 27, so that the silicon melt 11 contained within the crucible 21 can be solidified by lowering the support 28 to draw the crucible 21 downwards to a cooling zone (Bridgman process), or by introducing a cooling fluid into the support 28 (heat exchanger process).

In the conventional furnace described above, however, the gas inlet 25 of the gas flow guiding device only slightly protrudes into the hot zone beneath the upper insulation layer 23. As a consequence, the opening of the gas inlet 25 is located so far from the free surface of the silicon melt 11 contained in the crucible 21 (namely, the interface of the silicon melt and the gas) that the gas flow introduced through the gas inlet 25 fails to effectively carry the impurities away from the free surface and leads to an unfavorable result that the crystal ingot produced thereby has a high concentration of impurities and a reduced crystal quality.

SUMMARY OF THE INVENTION

Accordingly, an object of the invention is to provide a gas flow guiding device for use in a crystal-growing furnace that is capable of improving the quality of the crystal ingot produced thereby by effectively reducing the impurities present in the crystal ingot.

In order to achieve this object, a gas flow guiding device for use in a crystal-growing furnace is provided, which comprises an insulation layer enclosing a crucible, a gas inlet mounted in the insulation layer, and a gas exit formed in the insulation layer, so that the gas inlet is allowed to introduce a gas at a predetermined flow rate to generate a gas flow passing through the hot zone and carrying the impurity away from the furnace via the gas exit. A plurality of guide plates is radially arranged around the opening of the gas inlet, so that the free surface of the melt is blown by the gas flow guided by the guide plates. As a result, the crystal ingot thus obtained exhibits a reduced concentration of impurities and an improved crystal quality.

Preferably, the gas flow guiding device according to the invention additionally comprises a height-adjusting unit coupled to the gas inlet. The height-adjusting unit allows a precise control of the height of the gas inlet in relation to either the height of crucible or the height of the free surface of the melt during an actual operation, so as to maintain the distance between the opening of the gas inlet and the free surface of the melt contained in the crucible within a predetermined range. As a result, at a given gas flow rate, the impurities can be efficiently taken away from the free surface of the melt by the gas flow.

Preferably, the gas flow guiding device according to the invention additionally comprises an angle-adjusting unit provided between the respective guide plates and the gas inlet, so that the angles of the respective guide plates are adjustable according to the actual operation conditions. As such, the speed of the gas flow can be optimized depending on the growth of the crystal ingot and the quality of the crystal ingot produced can be precisely controlled.

BRIEF DESCRIPTION OF THE DRAWINGS

The above and other objects, features and effects of the invention will become apparent with reference to the following description of the preferred embodiments taken in conjunction with the accompanying drawings, in which.

DETAILED DESCRIPTION OF THE PREFERRED EMBODIMENTS

Figure 1:
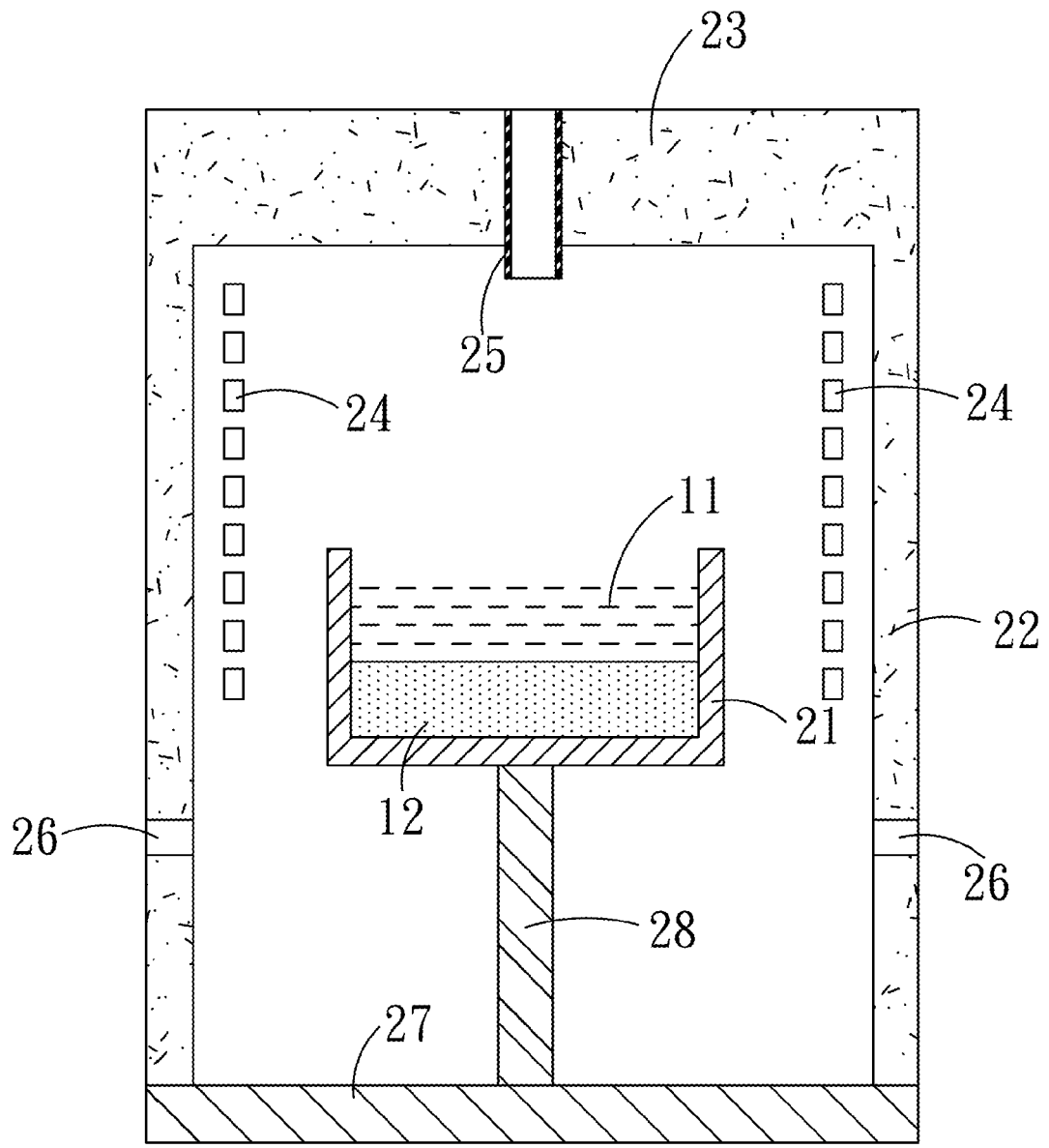
FIG. 1 is a schematic diagram illustrating the gas flow guiding device used in a conventional crystal-growing furnace.
Figure 2:
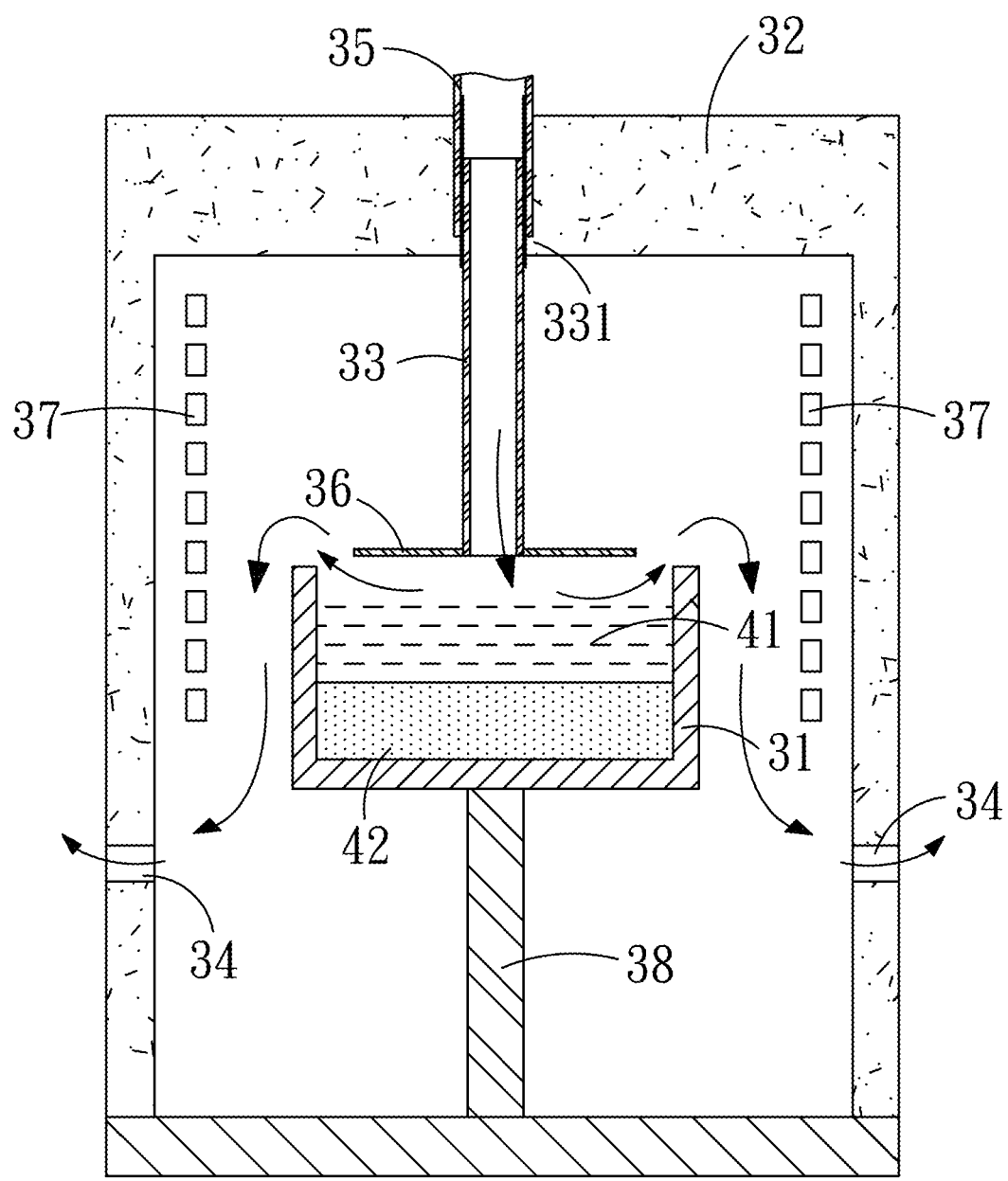
FIG. 2 is a schematic cross-sectional view of a crystal-growing furnace according to the invention.
Figure 3:
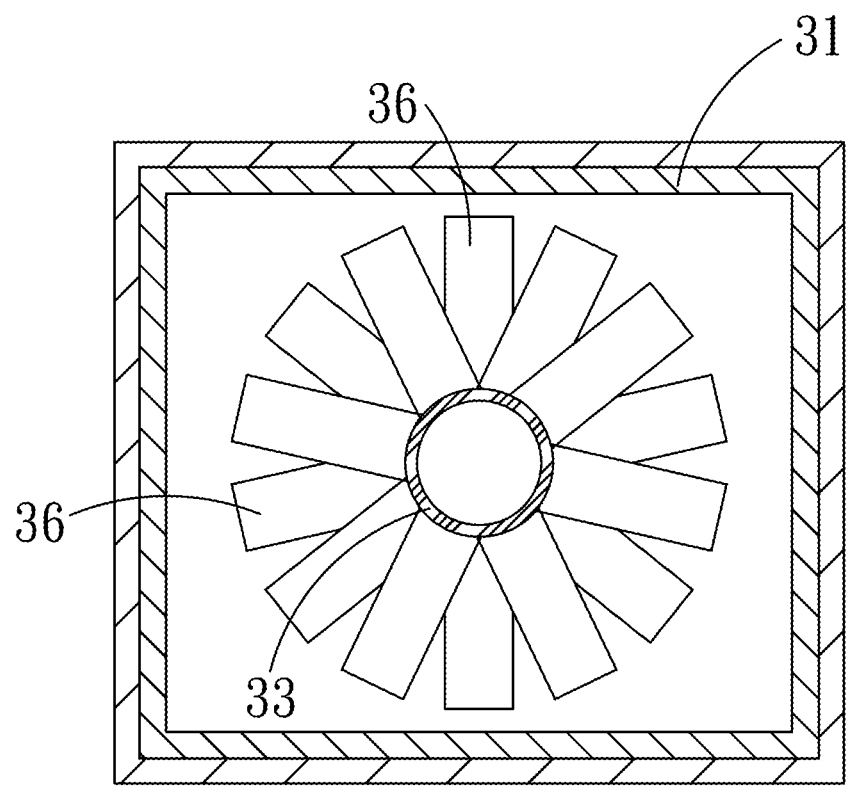
FIG. 3 is a schematic top view of the guide plates according to an example of the invention.

The present invention provides a gas flow guiding device for use in a crystal-growing furnace that is capable of improving the quality of the crystal ingot produced thereby by effectively reducing the impurities present in the crystal ingot. As shown in FIGS. 2 and 3, the furnace according to the invention generally comprises a crucible 31 for containing a silicon melt 41. The crucible 31 is surrounded circumferentially by an insulation layer 32, so as to constitute a hot zone, in which a heater 37 are equipped to provide heat to silicon.

The gas flow guiding device according to the invention comprises a gas inlet 33 protruding from the insulation layer 32, and a gas exit 34 formed in the insulation layer 32, so that the gas inlet 33 is allowed to introduce a gas at a predetermined flow rate to generate a gas flow passing through the hot zone and, thus, carrying the impurity away from the furnace via the gas exit 34. The gas flow guiding device is characterized by the technical features described below.

The gas inlet 33 is provided around its opening with a plurality of radially arranged guide plates 36 for guiding the gas flow from the gas inlet 33 to the regions surrounding the opening of the gas inlet 33, so that the free surface of the melt 41 is blown by the guided gas flow in such a manner that the gas flow takes impurities away from the free surface at a more rapid rate compared to the prior art. As a result, the crystal ingot obtained by solidifying the melt 41 will exhibit a reduced concentration of impurities and an improved crystal quality.

The furnace that is equipped with the gas flow guiding device according to the invention may be a furnace designed to solidify the melt 41 contained within the crucible 31 by reducing the output power of the heater (casting process), or a furnace designed to solidify the melt 41 contained within the crucible 31 by moving the insulation layer 32 upwards to effect radiant cooling of the crucible 31 (directional solidification system process).

It is apparent to one having ordinary skill in the art that the furnace which is equipped with the gas flow guiding device according to the invention may be additionally provided with a support 38 connected to an underside of the crucible 31, so that the melt 41 contained within the crucible 31 can be solidified by lowering the support 38 to draw the crucible 31 downwards to a cooling zone (Bridgman process), or by introducing a cooling fluid into the support 38 (heat exchanger process). All of the furnaces described herein may be provided with the gas flow guiding device disclosed herein to effectively reduce the concentration of impurities present in the crystal ingot 42 produced by solidifying the melt 41, thereby improving crystal quality of the crystal ingot 42.

Preferably, the gas flow guiding device according to the invention additionally includes a height-adjusting unit coupled to the gas inlet 33 and used to adjust the height of the gas inlet 33 in relation to the crucible 31. The height-adjusting unit includes an internally threaded sleeve 35 inserted substantially vertically into the insulation layer 32. The gas inlet 33 is provided on its outer surface with a threaded section 331 for engaging the threaded sleeve 35, so that the relative height of the gas inlet 33 can be adjusted by rotating the gas inlet 33 in relation to the threaded sleeve 35.

By virtue of the arrangement disclosed herein, the inventive gas flow guiding device for use in the furnace allows a precise control of the height of the gas inlet 33 in relation to the height of crucible 31 or the height of the free surface of the melt 41 during an actual operation, so as to maintain the distance between the opening of the gas inlet 33 and the free surface of the melt 41 contained in the crucible 31 within a predetermined range. As a result, at a given gas flow rate, the impurities can be more efficiently taken away from the free surface of the melt 41 by the gas flow according to the invention disclosed herein as compared to the prior art.

Figure 4:
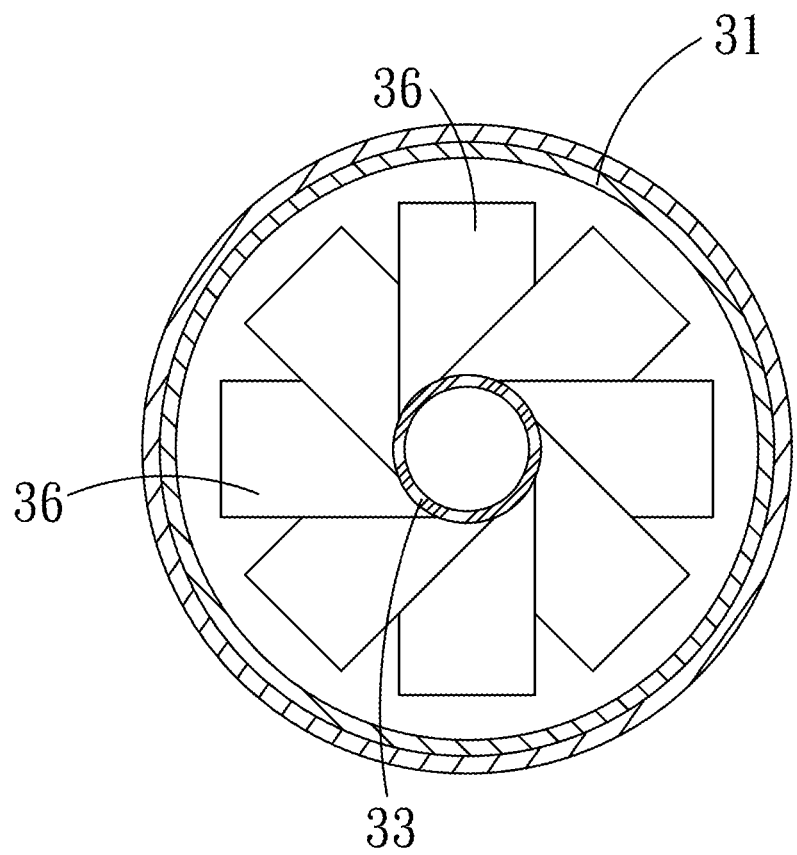
FIG. 4 is a schematic top view of the guide plates according to an alternative example of the invention.

Preferably, the crucible 31 is configured to have a cuboidal internal contour as shown in FIG. 3 or a cylindrical internal contour as shown in FIG. 4. The free ends of the respective guide plates 36 are kept apart from the internal wall of the crucible 31 by a predetermined distance. Preferably, in the gas flow guiding device according to the invention, two adjacent ones of the guide plates 36 are spaced apart at their free ends by a gap smaller than half of the width of the respective guide plates 36.

In addition, the gas flow guiding device according to the invention may preferably comprise an angle-adjusting unit provided between the respective guide plates 36 and the gas inlet, so that the angles of the respective guide plates 36 are adjustable according to the actual operation conditions. By virtue of this arrangement, the speed of the gas flow can be optimized depending on the growth of the crystal ingot and the quality of the crystal ingot can be precisely controlled.

Figure 5:
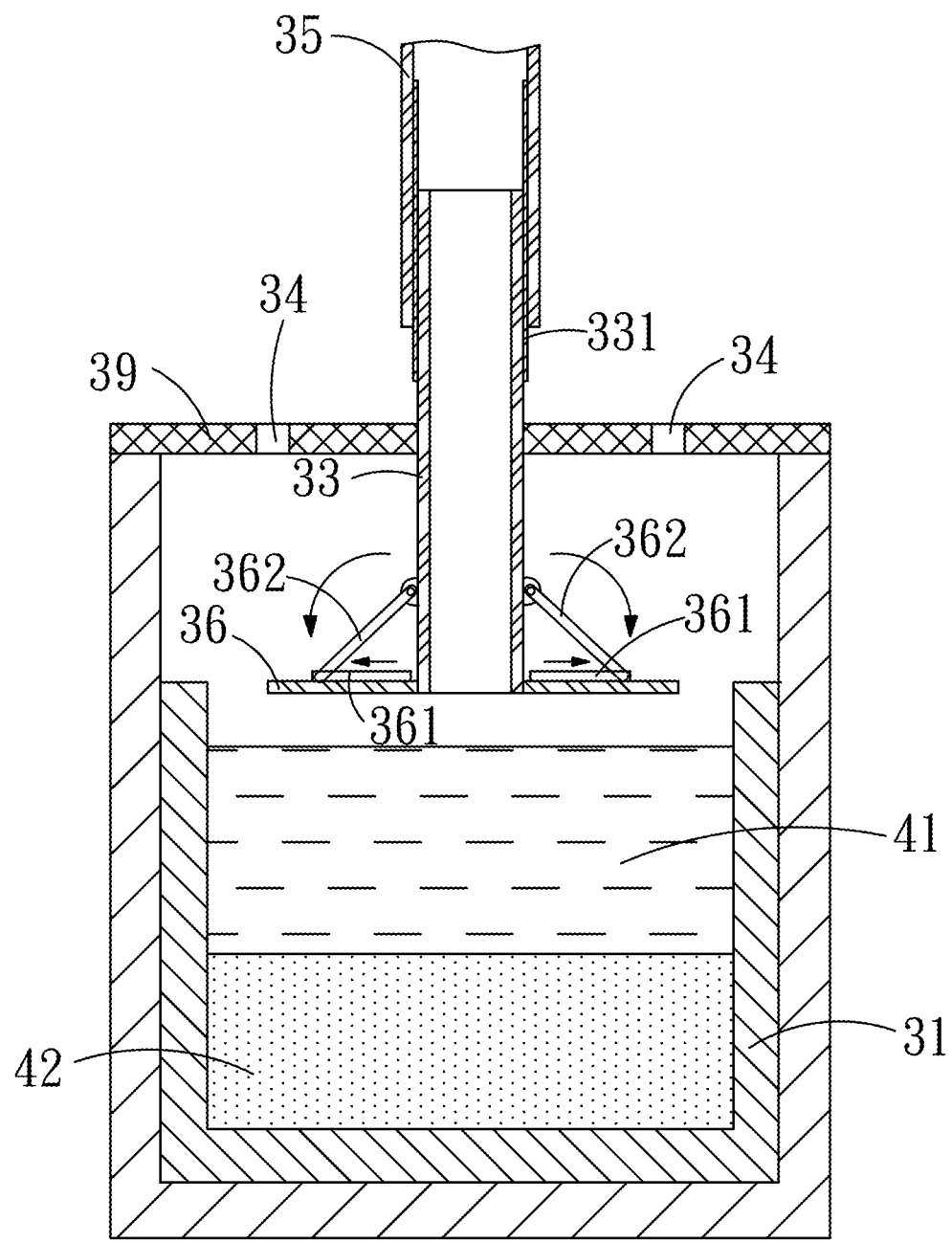
FIG. 5 is a schematic cross-sectional view of the gas flow guiding device according to the first preferred embodiment of the invention.
Figure 6:
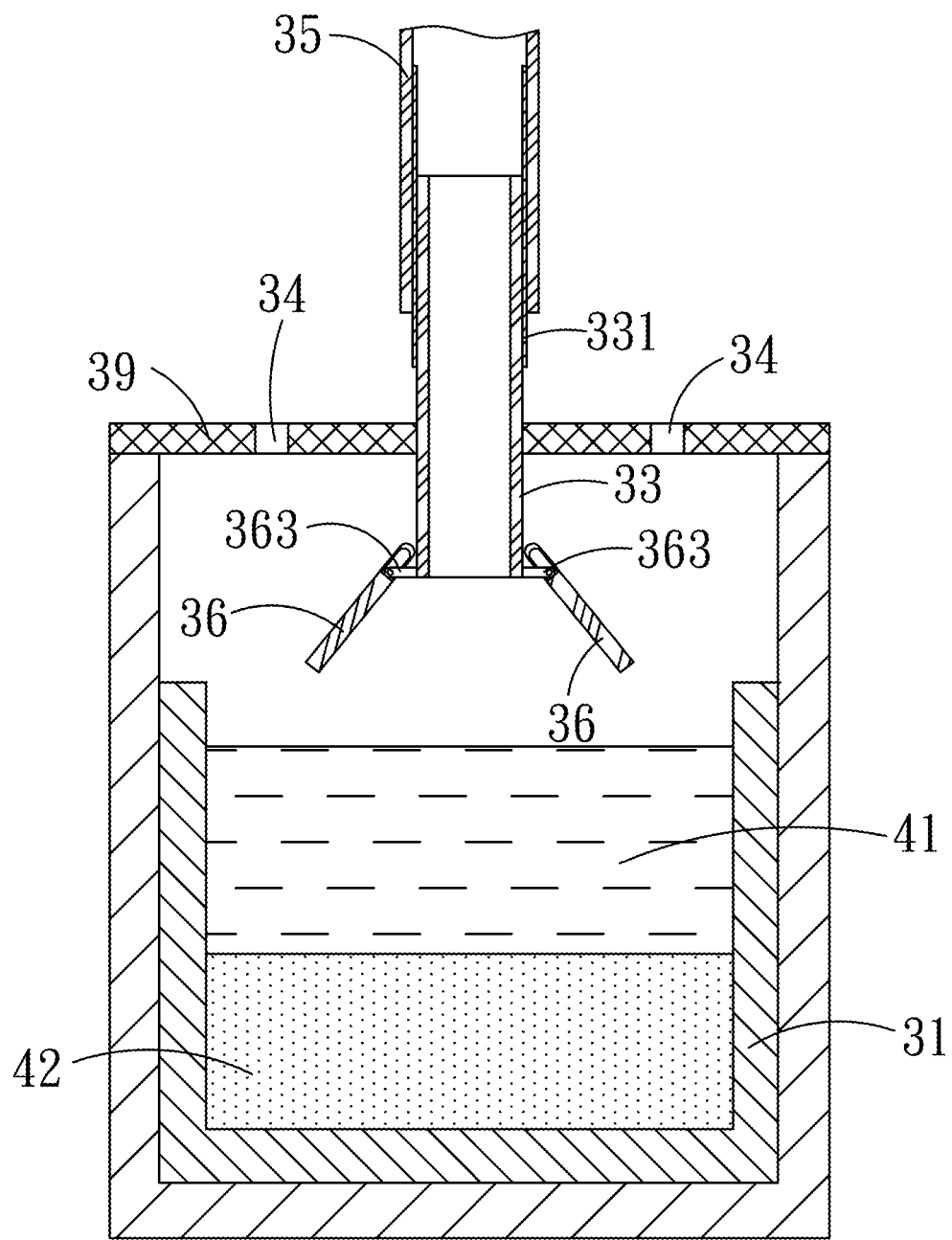
FIG. 6 is a schematic cross-sectional view of the gas flow guiding device according to the second preferred embodiment of the invention.

In actual practice, as shown in FIG. 5, the angle-adjusting unit may include a plurality of rails 361, each mounted on the corresponding one of the guide plates 36, and a plurality of linkages 362, each disposed between the corresponding one of the rails 361 and the gas inlet 33, such that the linkages 362 cooperate with the rails 361 to adjust the angle of the guide plates 36 relative to the gas inlet 33. As shown in FIG. 6, the angle-adjusting unit may alternatively include a plurality of hinge elements 363, each pivotally connecting the corresponding one of the guide plates 36 to the gas inlet 33 in such a manner that the angles of the respective guide plates 36 are adjustable relative to the gas inlet 33, thereby fulfilling the needs of changing the speed of the gas flow. Preferably, the respective guide plates 36 are positioned at an angle between 8~160 degree, more preferably at an angle of 90 or 150 degree, relative to the gas inlet 33. Preferably, the crucible 31 is provided above with a cover 39 formed with a gas exit 34.

The gas flow guiding device disclosed herein is tailored to dispose the guide plates 36 around the opening of the gas inlet 33 to allow the gas flow introduced through the gas inlet 33 to be guided by the guide plates 36, so that the free surface of the melt 41 is blown by the guided gas flow in such an effective manner that the crystal ingot thus produced exhibit a reduced concentration of impurities.

In conclusion, the gas flow guiding device for use in a crystal-growing furnace as disclosed herein can achieve the intended objects and effects of the invention by virtue of the structural arrangements described above. While the invention has been described with reference to the preferred embodiments above, it should be recognized that the preferred embodiments are given for the purpose of illustration only and are not intended to limit the scope of the present invention and that various modifications and changes, which will be apparent to those skilled in the relevant art, may be made without departing from the spirit of the invention and the scope thereof as defined in the appended claims.

What is claimed is:

1. A gas flow guiding device for use in a crystal-growing furnace, comprising:
   a crucible configured to contain a melt;
   an insulation layer enclosing the crucible and formed with a gas exit;
   a gas inlet mounted in the insulation layer and having an opening; and coupled with a height-adjusting the gas inlet in terms of a height relative to a crucible; and
   a plurality of guide plates radially arranged around the opening of the gas inlet and configured to guide a gas over the melt and with an angle-adjusting unit for adjusting the guide plates in terms of their angles relative to the gas inlet.

2. The gas flow guiding device for use in a crystal-growing furnace according to claim 1, wherein the height-adjusting unit comprises a threaded sleeve inserted into the insulation layer, and wherein the gas inlet is provided on its outer surface with a threaded section for engaging the threaded sleeve, so that the relative height of the gas inlet can be adjusted by rotating the gas inlet in relation to the threaded sleeve.

3. The gas flow guiding device for use in a crystal-growing furnace according to claim 1, wherein the angle-adjusting unit comprises a plurality of rails, each mounted on the corresponding one of the guide plates, and a plurality of linkages, each coupled between the corresponding one of the rails and the gas inlet.

4. The gas flow guiding device for use in a crystal-growing furnace according to claim 1, wherein the angle-adjusting unit comprises a plurality of hinge elements, each pivotally connecting the corresponding one of the guide plates to the gas inlet.

5. The gas flow guiding device for use in a crystal-growing furnace according to claim 1, wherein the height-adjusting unit comprises a threaded sleeve inserted into an insulated layer, and wherein the gas inlet is provided on its outer surface with a threaded section for engaging the threaded sleeve, so that the relative height of the gas inlet can be adjusted by rotating the gas inlet in relation to the threaded sleeve.

6. The gas flow guiding device for use in a crystal-growing furnace according to claim 1, wherein the angle-adjusting unit comprises a plurality of rails, each mounted on the corresponding one of the guide plates, and a plurality of linkages, each coupled between the corresponding one of the rails and the gas inlet.

7. The gas flow guiding device for use in a crystal-growing furnace according to claim 1, wherein the angle-adjusting unit comprises a plurality of hinge elements, each pivotally connecting the corresponding one of the guide plates to the gas inlet.

8. The gas flow guiding device for use in a crystal-growing furnace according to claim 1, wherein the crucible is provided above with a cover formed with a gas exit.

9. The gas flow guiding device for use in a crystal-growing furnace according to claim 1, wherein any two adjacent ones of the guide plates are spaced apart at their free ends by a gap smaller than half of a width of the respective guide plates.

* * * * *